United States Patent
Chen et al.

(10) Patent No.: US 6,236,092 B1
(45) Date of Patent: May 22, 2001

(54) MIXED MODE DEVICE

(75) Inventors: Cheng-Hsiung Chen, Taipei; Hsiu-Chin Chen, Taoyuan Hsien; Shen-Yuan Chou, Hsinchu; Shih-Yin Hsiao, Chiayi, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/493,387

(22) Filed: Jan. 28, 2000

(30) Foreign Application Priority Data

Jan. 6, 2000 (TW) .................................. 89100145

(51) Int. Cl.$^7$ .......................... H01L 29/76; H01L 29/94; H01L 31/062
(52) U.S. Cl. .......................... 257/401; 257/275; 257/341
(58) Field of Search .................................. 257/401, 275, 257/341

(56) References Cited

U.S. PATENT DOCUMENTS

| | | |
|---|---|---|
| 4,158,807 | * 6/1979 | Senturia . |
| 5,283,452 | * 2/1994 | Shih et al. . |
| 5,925,901 | * 7/1999 | Tsutsui . |
| 6,020,613 | * 2/2000 | Udomoto et al. . |

* cited by examiner

Primary Examiner—Stephen D. Meier
(74) Attorney, Agent, or Firm—Charles C. H. Wu; Charles C. H. Wu & Associates

(57) ABSTRACT

A mixed mode device. A polysilicon layer is over a substrate having a well therein. A first metal layer is formed over the polysilicon layer. A second metal layer is formed over the first metal layer. A conductive type of the well and a conductive type of the substrate are oppositive. A part of the polysilicon layer is positioned over the well. Heavily doped regions are further formed in the well beside the polysilicon layer. The polysilicon layer is used as gates of MOS transistors, and the heavily doped regions are used as source/drain regions of the MOS transistors. The first metal layer over the gate has a finger structure which electrically couples with the drain regions of the MOS transistors. The second metal layer electrically couples with the source regions through vias.

7 Claims, 3 Drawing Sheets

MIXED MODE DEVICE

CROSS-REFERENCE TO RELATED APPLICATION

This application claims the priority benefit of Taiwan application serial no. 89100145, filed Jan. 6, 2000.

BACKGROUND OF THE INVENTION

1. Field of the Invention

The invention relates in general to a design of a mixed mode device, and more particularly to a metal pad positioned on the top of the mixed mode device for connecting to a test device.

2. Description of the Related Art

Conventionally, the most commonly test pattern in a high frequency mixed mode device is a metal-oxide semiconductor transistor with a finger-type polysilicon layer as shown in FIG. 1.

Referring to FIG. 1, a well 102 is formed within a provided substrate 100. A conductive type of the well 102 and a conductive type of the substrate 100 are oppositive. A finger-type polysilicon layer 104 is formed over the substrate 100 and is positioned on the well 102. The finger-type polysilicon layer 104 is used as gates of MOS transistors. Heavily doped regions are formed within the substrate 100 beside the finger-type polysilicon 104. Source/drain regions 106/108 are thus formed. A finger-type first metal layer 110 is formed over the gates. The first metal layer 110 electrically couples with the drain regions 108. A second metal layer 112 with a rectangular shape is formed over the first metal layer 110. The second metal 112 electrically connects to the source regions 106 through vias 114.

A network analyzer is used to test quality of the mixed mode device. The gates of polysilicon 104 are connected to a transmission side of the network analyzer to transfer a current signal. The drain regions 108 of the MOS transistors are connected to a receiver side of the network analyzer to receive the current signal. The source regions 106 and gates of the MOS transistors are grounded.

Since the second metal layer 112 connects to the source regions 106, the source regions 106 are grounded through the second metal layer 112. A circuitry of the mixed mode device is shown in FIG. 2. A voltage is applied on the gate 204 of a MOS transistor. A current is brought from the drain region 202 of the MOS transistor. The mixed mode device shown in FIG. 1 comprises several MOS transistors. Each source region 106 of the MOS transistors is connected to the second metal layer 112 through the vias 114. Areas of the second metal layer 112 over the source regions 106 are the same. Currents of the source regions 106 are the same so that a concourse of the currents to the second metal layer 112 makes a voltage of the second metal layer 112 become higher and higher. A negative feedback is thus formed at the source side.

SUMMARY OF THE INVENTION

The invention provides a mixed mode device. Area of the second metal layer of the mixed mode is adjusted according to current from source regions. Resistance of the second metal layer is thus decreased to reduce the negative feedback at the source regions.

The provided mixed mode device of the invention comprises a substrate having a well therein, a polysilicon layer over the substrate, a first metal layer over the polysilicon layer, and a second metal layer over the first metal layer. A conductive type of the well and a conductive type of the substrate are oppositive. A part of the polysilicon layer is positioned over the well. Heavily doped regions are further formed in the well beside the polysilicon layer. The polysilicon layer is used as gates of MOS transistors, and the heavily doped regions are used as source/drain regions of the MOS transistors. The first metal layer over the gate has a finger structure which electrically couples with the drain regions of the MOS transistors. The second metal layer electrically couples with the source regions through vias.

The second metal has two portions. One portion comprises rectangles and the other portion comprises trapezoids. The rectangles are over and connecting to the vias. Each of the trapezoids respectively cross over source region-gate-drain region areas. The top border of each trapezoid is shorter than the bottom border so that a rectangle adjacent the top border is smaller than a rectangle adjacent the bottom border. Unit area of the second metal layer is thus increased to reduce resistance of the second metal layer. Accordingly, the negative feedback from increasing current is prevented. Furthermore, the parts of the second metal layer connecting to the vias are rectangular. The vias are completely covered by the second metal layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
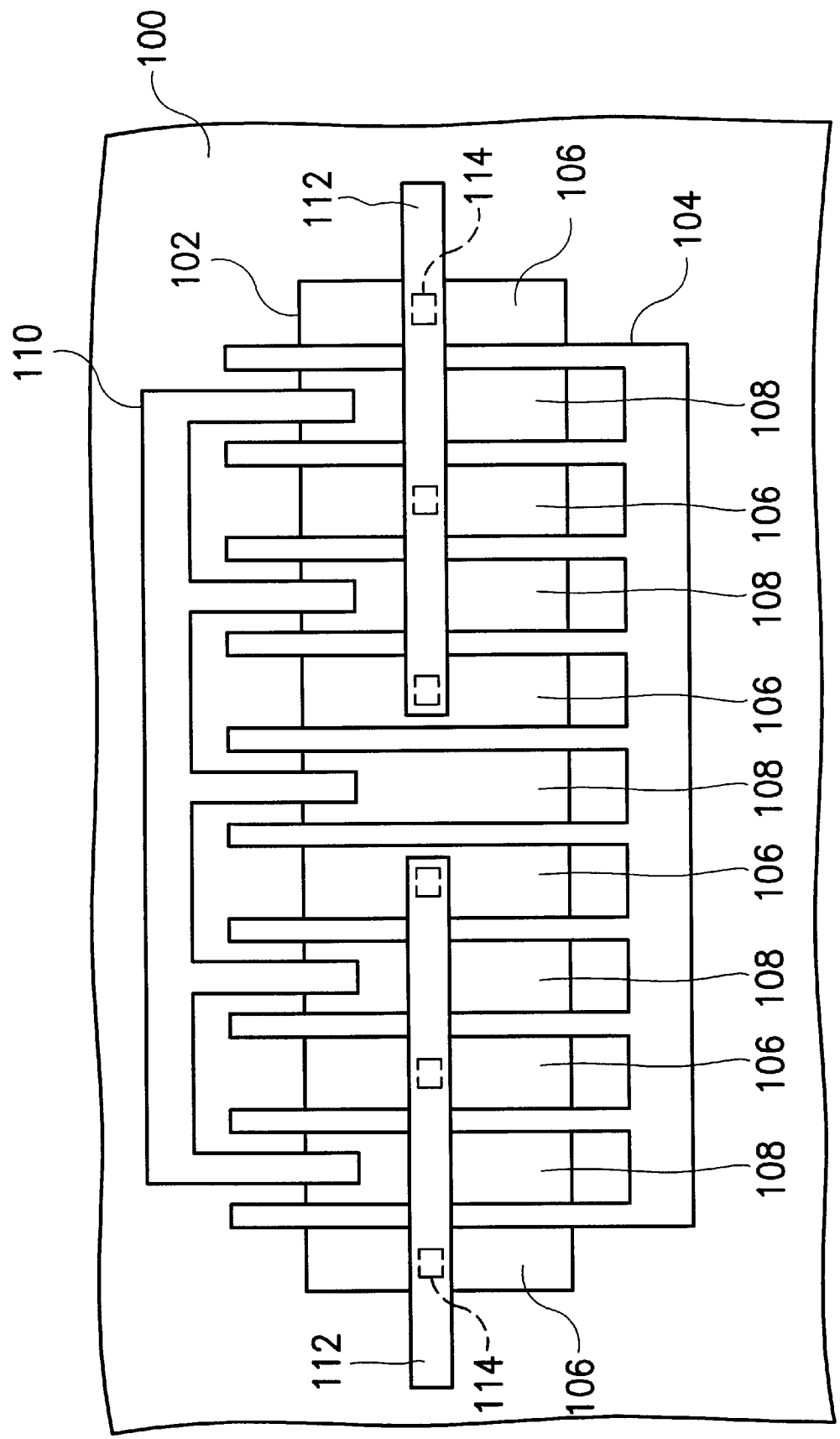
FIG. 1 is a top view showing a structure of a conventional mixed mode device.
Figure 2:
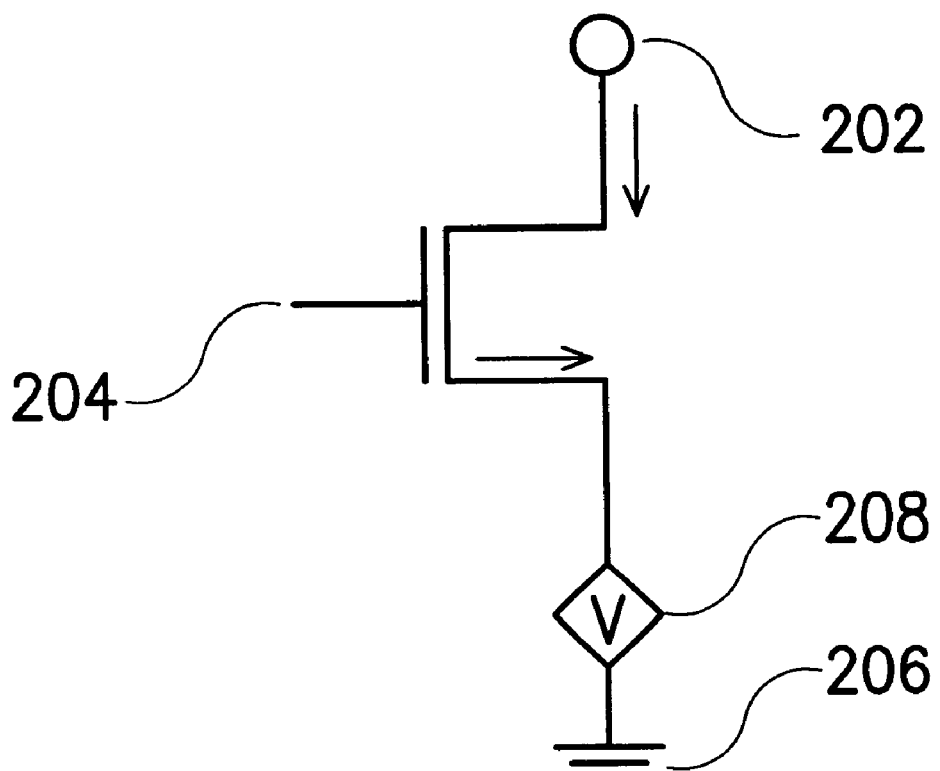
FIG. 2 is a circuit diagram showing the conventional mixed mode device of FIG. 1.
Figure 3:
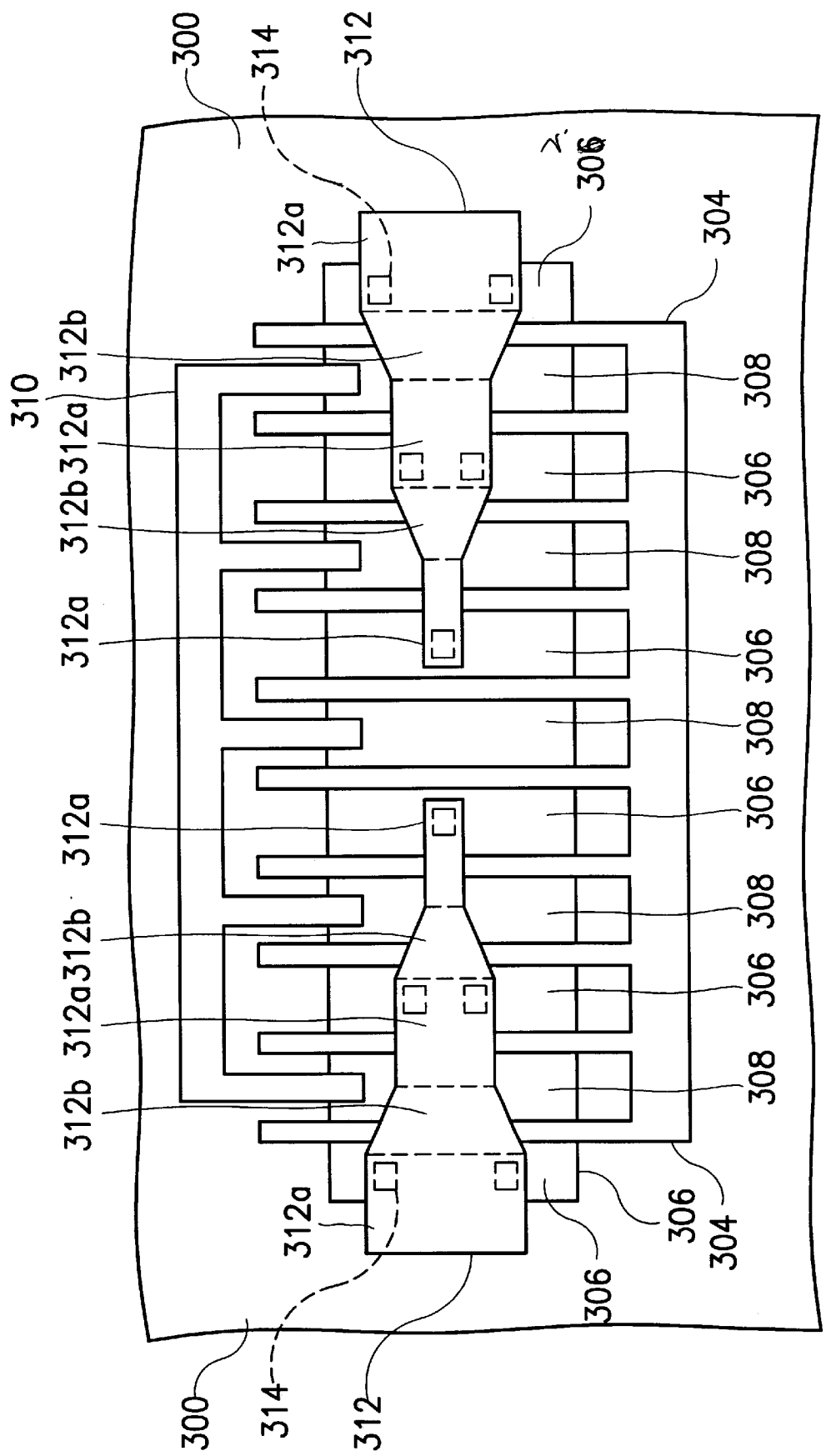
FIG. 3 is a top view showing a structure of mixed mode device of one preferred embodiment of the invention.

FIG. 3 is a top view showing a structure of mixed mode device of one preferred embodiment of the invention. Referring to FIG. 3, the mixed mode device of the invention comprises a substrate 300 at least having a well 302. A conductive type of the substrate 300 and a conductive type of the well 302 are appositive. A polysilicon layer 304 is formed over the substrate 300. At least a part of the polysilicon layer 304 is positioned on the well 302, and is used to form gates of MOS transistors. Heavy doped regions are formed within the well 302 beside the gates, which are used as source/drain regions 306/308 of the MOS transistors.

A first metal layer 310 is formed over the gates. The first metal layer 310 has a finger structure and electrically connects to the drain regions 308. A second metal layer 312 is formed over the first metal layer 310 and electrically connects to the source regions 306 through vias 314. The second metal layer 312 is used as a metal pad, which can connect to a test analyzer. The second metal layer 312 has two portions. The first portion comprises rectangular segments 312*a*. The second portion comprises scalariform segments 312*b*. The rectangular segments 312*a* and the scalariform segments 312*b* are alternately adjacent. The rectangular segments 312*a* are connected to the source regions 306 through the vias 314. The scalariform segments 312*b* cross over the source-gate-drain regions.

Resistance and length of a conductive layer are directly proportional, and the resistance and area of a cross-section of the conductive layer are inversely proportional. Further, a top length of one of the scalariform segments is shorter than a bottom length of the scalariform segment. Area of a rectangular segment adjacent to the top length is smaller than area of a rectangular segment adjacent the bottom length. Unit area of the second metal layer 312 is thus increased to reduce resistance of the unit area of the second metal layer 312. A negative feedback due to increasing current of a conventional mixed mode device can be prevented.

Furthermore, the parts of the second metal layer connecting to the vias are rectangular. The vias are completely covered by the second metal layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mixed mode device, comprising:

a plurality of MOS transistors, comprising a plurality of source/drain regions;

a first metal layer over the MOS transistors, wherein the first metal layer is electrically connected to the source regions of the MOS transistors; and a second metal layer over the MOS transistors, wherein the second metal layer is electrically connected to the drain regions of the MOS transistors through a plurality of vias;

wherein the second metal layer comprises rectangular segments crossing source-gate-drain and scalariform segments crossing drain-gate-source.

2. The mixed mode device according to claim 1, wherein unit area of the second metal layer is increased from inside to outside of the mixed mode device.

3. A metal pad of a mixed mode device comprising a plurality of MOS transistors comprising:

a plurality of rectangular segments; and a plurality of scalariform segments, wherein the rectangular segments are positioned over source regions of the MOS transistors and electrically connected to the source regions, and the scalariform segments are positioned over drain regions of the MOS transistors and electrically connected to the drain regions.

4. The metal pad according to claim 3, wherein the rectangular segments cover regions comprising a portion of source-gate-drain of each of the MOS transistors.

5. The metal pad according to claim 3, wherein the scalariform segments cover regions comprising a portion of drain-gate-source of each of the MOS transistors.

6. The metal pad according claim 3, wherein the rectangular segments and the scalariform segments are alternatively adjacent.

7. The metal pad according claim 3, wherein the rectangular segments and the scalariform segments comprise metal materials.

* * * * *